(12) United States Patent
Hikmet et al.

(10) Patent No.: US 10,386,559 B2
(45) Date of Patent: Aug. 20, 2019

(54) LIGHT EMITTING DEVICE COMPRISING WAVELENGTH CONVERTER

(71) Applicant: SIGNIFY HOLDING B.V., Eindhoven (NL)

(72) Inventors: Rifat Ata Mustafa Hikmet, Eindhoven (NL); Dominique Maria Bruls, Heeze (NL); Ties Van Bommel, Horst (NL); Dirk Kornelis Gerhardus De Boer, Den Bosch (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 172 days.

(21) Appl. No.: 14/781,068

(22) PCT Filed: Mar. 20, 2014

(86) PCT No.: PCT/IB2014/060001
§ 371 (c)(1),
(2) Date: Sep. 29, 2015

(87) PCT Pub. No.: WO2014/155250
PCT Pub. Date: Oct. 2, 2014

(65) Prior Publication Data
US 2016/0054501 A1 Feb. 25, 2016

Related U.S. Application Data

(60) Provisional application No. 61/806,450, filed on Mar. 29, 2013.

(51) Int. Cl.
*F21V 8/00* (2006.01)
*H01L 33/50* (2010.01)
(Continued)

(52) U.S. Cl.
CPC ......... *G02B 6/0003* (2013.01); *G02B 6/0046* (2013.01); *G02B 6/0068* (2013.01);
(Continued)

(58) Field of Classification Search
CPC .... G02B 6/0046; G02B 6/0003; H01L 33/505
See application file for complete search history.

(56) References Cited

U.S. PATENT DOCUMENTS 8,071,988 B2 12/2011 Lee et al.
8,309,969 B2 11/2012 Suehiro et al.
(Continued)

FOREIGN PATENT DOCUMENTS

EP 2202444 A1 6/2010
EP 2346101 A1 7/2011
(Continued)

*Primary Examiner* — Anh T Mai
*Assistant Examiner* — Zachary J Snyder
(74) *Attorney, Agent, or Firm* — Akarsh P. Belagodu

(57) ABSTRACT

A light emitting device (102, 202) comprising a light source (104) having a light exit surface, a wavelength converter (106) configured to convert light from a first wavelength to a second wavelength, said wavelength converter having a light exit surface (110) and a light entrance surface, a heat sink (100) and an optical coupling element (112), arranged in thermal connection with said heat sink (100) and said wavelength converter (106), wherein said optical coupling element (112) is selected to have a refractive index lower than a refractive index of said wavelength converter (106). The optical coupling element (112) will allow for an efficient heat transfer from the wavelength converter (106) to the heat sink (100) while avoiding loss of light from unwanted surfaces.

15 Claims, 10 Drawing Sheets

(51) Int. Cl.
*H01L 33/64* (2010.01)
*H01L 25/075* (2006.01)

(52) U.S. Cl.
CPC ......... *G02B 6/0073* (2013.01); *G02B 6/0085* (2013.01); *H01L 33/505* (2013.01); *H01L 25/0753* (2013.01); *H01L 33/642* (2013.01); *H01L 2924/0002* (2013.01)

(56) References Cited

U.S. PATENT DOCUMENTS

| | | |
|---|---|---|
| 2006/0221638 A1 | 10/2006 | Chew et al. |
| 2006/0279950 A1 | 12/2006 | Hama et al. |
| 2007/0279914 A1 | 12/2007 | Rutherford et al. |
| 2007/0285943 A1* | 12/2007 | Ouderkirk ............ G02B 6/0001 362/609 |
| 2008/0149166 A1 | 6/2008 | Beeson et al. |
| 2009/0078949 A1 | 3/2009 | Bechtel et al. |
| 2009/0173958 A1 | 7/2009 | Chakraborty et al. |
| 2009/0244923 A1 | 10/2009 | Hofmann et al. |
| 2010/0181582 A1 | 7/2010 | Li et al. |
| 2010/0295075 A1 | 11/2010 | Smith et al. |
| 2010/0315817 A1 | 12/2010 | Zimmermann |
| 2011/0018020 A1 | 1/2011 | Jagt |
| 2011/0069491 A1* | 3/2011 | Shin .................. F21V 3/04 362/268 |
| 2011/0121703 A1* | 5/2011 | Karlicek, Jr. ......... G02B 6/0085 313/46 |
| 2011/0156081 A1 | 6/2011 | De Carvalho Esteves et al. |
| 2011/0309384 A1 | 12/2011 | Ito et al. |
| 2012/0032217 A1 | 2/2012 | Yen |
| 2012/0039079 A1* | 2/2012 | Pan ...................... G02B 6/0016 362/326 |
| 2012/0126274 A1 | 5/2012 | Jagt et al. |
| 2012/0280264 A1 | 11/2012 | Beeson et al. |
| 2012/0299463 A1 | 11/2012 | Kume |
| 2013/0051069 A1* | 2/2013 | Moon ............... G02F 1/133615 362/608 |
| 2014/0036203 A1* | 2/2014 | Guillou ............... G02B 6/0003 349/62 |

FOREIGN PATENT DOCUMENTS

| | | |
|---|---|---|
| GB | 2468875 A | 9/2010 |
| JP | 2007171891 A | 7/2007 |
| JP | 2007266358 A | 10/2007 |
| JP | 2010541221 A | 12/2010 |
| JP | 2013038115 A2 | 2/2013 |
| WO | WO2009048704 A2 | 4/2009 |
| WO | WO2010010484 A1 | 1/2010 |
| WO | WO2011001751 A1 | 1/2011 |
| WO | WO2012042452 A2 | 4/2012 |
| WO | WO2012135504 A1 | 10/2012 |

* cited by examiner

LIGHT EMITTING DEVICE COMPRISING WAVELENGTH CONVERTER

CROSS-REFERENCE TO PRIOR APPLICATIONS

This application is the U.S. National Phase application under 35 U.S.C. § 371 of International Application No. PCT/IB14/060001, filed on Mar. 20, 2014, which claims the benefit of U.S. Provisional Patent Application No. 61/806,450, filed on Mar. 29, 2013. These applications are hereby incorporated by reference herein.

FIELD OF THE INVENTION

The invention relates to a light emitting device. In particular, the invention relates to an improved light emitting device comprising a wavelength converter.

BACKGROUND OF THE INVENTION

The development of new and more energy efficient illumination devices is one of the important technical challenges which society faces. Common technologies which are more energy efficient than traditional lighting solutions are often based on Light Emitting Diodes (LEDs). High intensity light sources are interesting for many applications including spot lighting and digital light projection. For these purposes it is possible to use wavelength converters which convert light of a shorter wavelength, to light of a longer wavelength in a highly transparent luminescent material. In order to increase the intensity of the light emitted, light of a longer wavelength can then be extracted from just one surface of a wavelength converter.

However, in such applications it is important to effectively couple the light from a light source into the wavelength converter which often comprises transparent phosphor for providing wavelength conversion. Furthermore, it is desirable to maintain the generated light within the luminescent layer to avoid light loss from the points where LEDs are optically coupled to the luminescent layer. U.S. Pat. No. 7,982,229 describes a conversion structure comprising phosphor which receives light from blue LEDs, converts the light into longer-wavelength light and guides it to an exit surface, where the resulting brightness can be high. Furthermore it is suggested that there is no optical contact between the light source and the transparent luminescent material. In such a configuration, energy is dissipated within the luminescent element as light is converted to longer wavelengths. This leads to a considerable temperature increase within such an element if the heat produced is not transported away from the luminescent layer. Using an optical contact between the light source and the wavelength converter may improve the cooling such that the temperature is reduced, however an optical contact may also lead to losses of light generated within a wavelength converter through the optical contact to a surrounding medium.

SUMMARY

With regards to the above-mentioned desired properties of a light emitting device, it is a general object of the present invention to enable improved performance of a light emitting device through an improved light emitting device.

According to a first aspect of the invention, these and other objectives are achieved through a light emitting device comprising a light source having a light exit surface, a wavelength converter configured to convert light from a first wavelength to a second wavelength, the wavelength converter having a light exit surface and a light entrance surface, a heat sink and an optical coupling element arranged in contact with the wavelength converter, and in thermal connection with the heat sink, wherein the optical coupling element is selected to have a refractive index lower than a refractive index of the wavelength converter.

The present invention is based on the realization that by tailoring the refractive index of an optical coupling element to be lower than the refractive index of the wavelength converter which it is in contact with, the optical coupling element will allow for an efficient heat transfer from a wavelength converter to a heat sink while reducing losses resulting from light being coupled out at the interface between the wavelength converter and the optical coupling element. Hence a larger portion of the light produced by the light source will be emitted from a light exit surface of a wavelength converter in a light emitting device.

By light emitting device it should be understood that the purpose of the device is to provide lighting, and that the light source, which is commonly a LED, is the main component providing this function. The wavelength converter is configured to convert light from a first wavelength to a second wavelength and to guide converted and unconverted light to the light exit surface. It should be noted that this conversion may also be a first plurality of wavelengths (i.e. a first spectrum) into a second plurality of wavelengths (i.e. a second spectrum). Furthermore, the wavelength converter is typically provided in the form of a luminescent structure comprising phosphor. The optical coupling element may be understood to provide a thermal coupling between the wavelength converter and the heat sink, which will enable the wavelength converter to convert light more efficiently for a longer period of time, or indefinitely, without failure or reduced performance due to a too high temperature. The refractive index of the optical coupling element will determine the portion of light being reflected at the interface between the optical coupling element and the wavelength converter for a given wavelength. A lower refractive index of the optical coupling element is selected in relation to the refractive index of the wavelength converter such that a larger portion of light impinging on the interface between the wavelength converter and the optical coupling element is reflected, thereby enabling a larger portion of the converted light to be emitted in a desired direction. Concurrently, configuring the refractive index of the optical coupling element in relation to the wavelength converter will enable a larger portion of light to be transmitted through the interface from the optical coupling element and into the wavelength converter, which thereby will increase the portion of light converted in the wavelength converter, whereby a larger portion of light will be emitted in a desired direction by the light emitting device.

According to one embodiment of the invention the light source may be arranged in contact with the heat sink, and the optical coupling element may be arranged between and in contact with the light exit surface of the light source and the light entrance surface of the wavelength converter.

The heat sink will be thermally coupled to the light source, and the optical coupling element is arranged between and in contact with the light source and the wavelength converter. Through such an arrangement the optical coupling element will transfer heat from the wavelength converter, into the light source, and the light source will transfer heat into the heat sink. The entire light emitting device will then be kept at a substantially similar temperature. Furthermore, the optical coupling element arranged between the wavelength converter and the light source will guide light from the light source into to the wavelength converter which will enable a larger portion of light to enter the wavelength converter.

In one embodiment of the invention the optical coupling element may be sandwiched between the heat sink and the wavelength converter, and the light source may be arranged at a distance from the light entrance surface of the wavelength converter.

Sandwiching, i.e. arranging between and in contact with, the optical coupling element between the heat sink and wavelength converter will enable the optical coupling element to transfer heat from the wavelength converter into the heat sink. The light source arranged at a distance will be thermally decoupled from the wavelength converter. Hence the heat produced by the light source, in use, will not substantially affect the wavelength converter.

According to one embodiment of the invention, the refractive index of the optical coupling element may be in the range of 1.0-1.7, preferably 1.1-1.6 and most preferably 1.2-1.5 and the refractive index of the wavelength converter may be in the range of 1.5-2.0, preferably 1.7-1.9 and most preferably 1.8. Any combination of the refractive index of the optical coupling element and the refractive index of the wavelength converter is possible, but preferably the refractive index of the wavelength converter is higher than the refractive index of the optical coupling element.

The ranges and values given for the refractive indexes above advantageously has been demonstrated to provide a large degree of total internal reflection (TIR) at the interface between the wavelength converter and the optical coupling element. Furthermore the ranges and values for the refractive indexes above will also provide a large degree of TIR at an interface between the wavelength converter and a surrounding medium (e.g. air).

According to another embodiment of the invention the optical coupling element may have a thickness less than 100 micrometers.

A thickness less than 100 micrometers will enable a large portion of light to couple from the light source into the wavelength converter by the optical coupling element. The optical coupling element will also affect heat transfer from the wavelength converter to the light source, a thickness less than 100 micrometers will advantageously allow an effective and quick heat transfer through the optical coupling element.

According to one embodiment of the invention the light exit surface of the light source, may have a predetermined surface roughness, $R_A$, configured to diffusively reflect light.

According to another embodiment of the invention, a surface of the heat sink facing the wavelength converter may have a predetermined surface roughness, $R_A$, configured to diffusively reflect light.

A diffusively reflecting surface will reflect light impinging upon it in all directions (i.e. angles) facing away from the surface. An ordinary mirror (reflecting) surface will reflect incident light with an angle of reflection which is equal to the angle of incidence, which follows from the well-known law of reflection. Configuring the surface to diffusively reflect light will enable a larger portion of light incident upon, the light exit surface of the light source, or a surface of the heat sink facing the wavelength converter, to obtain an angle that will enable the light to be guided back towards the wavelength converter through the optical coupling element.

According to another embodiment of the invention the wavelength converter may comprise a monocrystalline material and/or monolithic polycrystalline material. Monocrystalline and/or monolithic polycrystalline materials will be optically isotropic, and also non-birefringent which are effects that will preferably be incorporated in the wavelength converter. An optically isotropic and non-birefringent material will allow an improved control of the light in the wavelength converter.

According to one embodiment of the invention, the wavelength converter may comprise either Ce doped Yttrium aluminum garnet (YAG, $Y_3AL_5O_{12}$), Lutetium-Aluminum-Garnet (LuAG), LuGaAG or LUYAG. YAG, LUAG, LuGaAG and LuYAG are able to have refractive indexes in the preferred ranges and also convert light, hence they will be used for the wavelength converter.

In another embodiment of the invention the optical coupling element may comprise organic or silicone based oils or glues, or a fluoropolymer such as polytetrafluoroethylene (PTFE). Organic or silicone based oils or glues and fluoropolymers are able to produce refractive indexes in the preferred ranges and are also able to conduct heat.

In one embodiment of the invention the wavelength converter may advantageously be shaped such that the light exit surface is larger than a surface arranged opposite to the light exit surface. Accordingly, the wavelength converter may advantageously be shaped as a wedge or frustum. Increasing the size of the light exit surface in relation to the opposite surface allows a larger portion of light reflected in the surface opposite the light exit surface to be emitted through the light exit surface. Furthermore, by shaping the wavelength converter as a wedge or frustum, a larger light exit surface can be chosen such that the other surfaces will direct the light towards the light exit surface.

In one embodiment of the invention the light emitting device may further comprise at least one reflecting element, arranged facing, and at a distance from, at least a surface of the wavelength converter opposite the light exit surface of the wavelength converter. A reflecting element will advantageously be used to reflect light, which has passed through an interface between the wavelength converter and a surrounding medium at an unwanted surface, back into the wavelength converter. The reflecting element will be a mirror or a diffuse reflector. Commercial alternatives for a mirror are available, such as Miro silver (ALANOD) while another alternative for a diffuse reflective element may be a micro cellular polyethylene terephtalate (MCPET).

According to one embodiment of the invention, the at least one reflecting element may advantageously be arranged at a distance from the wavelength converter which is larger than the first and second wavelength. Separating the reflecting element from the wavelength converter will ensure that a portion of the light which has passed through the interface between the wavelength converter and a surrounding medium is reflected back into the wavelength converter. Furthermore, arranging the reflector at a distance larger than the first or second wavelength has the effect of optically decoupling the reflector from the wavelength converter.

According to an embodiment of the invention the light exit surface and the light entrance surface extend in an angle different from zero to one another. In other words, the light exit surface and the light entrance surface extend in planes that are not parallel to each other. In this way a light emitting device is obtained with which more light is coupled into the wavelength converter and with which an optimally large amount of light is guided towards the respective light exit surface by means of total internal reflection (TIR). This in turn lowers the amount of light lost by exiting the wavelength converter, acting also as a light guide, through other surfaces than the light exit surface and thus further increases the intensity and thus the light exit surface and the light entrance surface extend in an angle different from zero to one another brightness of the light emitted through the light exit surface. In an embodiment the light exit surface and the light entrance surface are perpendicular to one another.

Further features of, and advantages with, the present invention will become apparent when studying the appended claims and the following description. The skilled person realize that different features of the present invention may be combined to create embodiments other than those described in the following, without departing from the scope of the present invention.

BRIEF DESCRIPTION OF THE DRAWINGS

This and other aspects of the present invention will now be described in more detail, with reference to the appended drawings showing an embodiment of the invention.

DETAILED DESCRIPTION OF THE DRAWINGS

Figure 1:
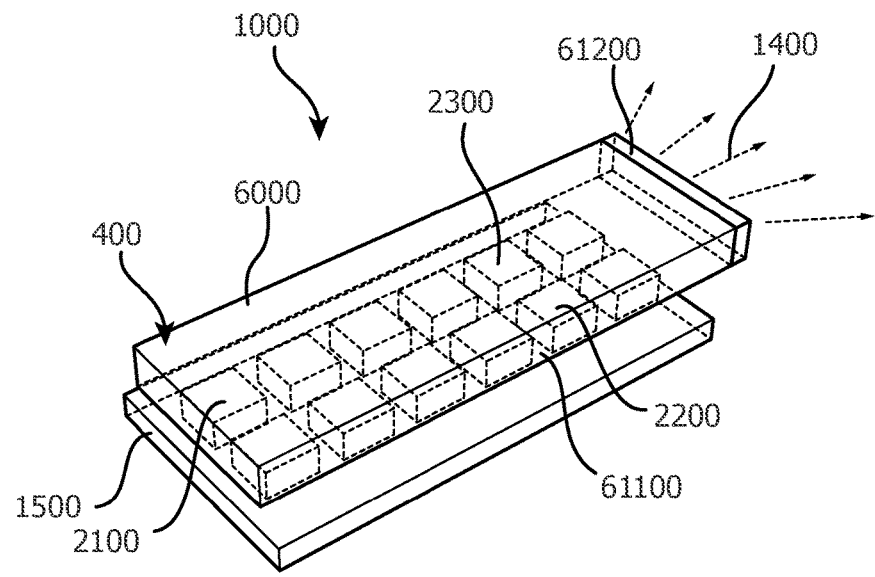
FIG. 1 shows a 3-dimensional perspective view of a light emitting device comprising an exit phosphor.

As illustrated in the figures, the sizes of layers, elements and regions are exaggerated for illustrative purposes and, thus, are provided to illustrate the general structures of embodiments of the present invention. Like reference numerals refer to like elements throughout, such that e.g. a light emitting device according to the invention is generally denoted 1, whereas different specific embodiments thereof are denoted by adding 01, 02, 03 and so forth to the general reference numeral. With regard to FIGS. 1 to 12D showing a number of features and elements which may be added to any one of the embodiments of a light emitting device according to the invention, "00" has been added to all elements except those specific to one of these Figures.

The present invention will now be described more fully hereinafter with reference to the accompanying drawings, in which currently preferred embodiments of the invention are shown. This invention may, however, be embodied in many different forms and should not be construed as limited to the embodiments set forth herein; rather, these embodiments are provided for thoroughness and completeness, and fully convey the scope of the invention to the skilled person.

The following description will start with general considerations regarding applications, suitable light sources and suitable materials for various elements and features of a light emitting device according to the invention. Thereupon a number of features and elements which may be added to any one of the embodiments of a light emitting device according to the invention will be described with reference to FIGS. 1 to 12D. Finally, a number of specific embodiments of a light emitting device according to the invention will be described in detail with reference to FIGS. 13 to 15.

A light emitting device according to the invention may be used in applications including but not being limited to a lamp, a light module, a luminaire, a spot light, a flash light, a projector, a digital projection device, automotive lighting such as e.g. a headlight or a taillight of a motor vehicle, arena lighting, theater lighting and architectural lighting.

The light emitting device according to the invention comprises a light source, which is adapted for, in operation, emitting light with a first spectral distribution. This light is subsequently coupled into a light guide which furthermore is arranged to convert the wavelength of the incoming light to another wavelength range. The light guide is also called a wavelength converter or waveguide throughout the description of the invention. The light guide converts the light of the first spectral distribution to another spectral distribution and guides the light to an exit surface. The light source may in principle be any type of point light source, but is in an embodiment a solid state light source such as a Light Emitting Diode (LED), a Laser Diode or Organic Light Emitting Diode (OLED), a plurality of LEDs or Laser Diodes or OLEDs or an array of LEDs or Laser Diodes or OLEDs. The LED may in principle be an LED of any color, and is in an embodiment a blue light source producing light source light in the blue color-range which is defined as a wavelength range of between 380 nm and 495 nm. In another embodiment, the light source is an UV or violet light source, i.e. emitting in a wavelength range of below 420 nm. In case of a plurality or an array of LEDs or Laser Diodes or OLEDs, the LEDs or Laser Diodes or OLEDs may in principle be LEDs or Laser Diodes or OLEDs of two or more different colors, such as, but not limited to, UV, blue, green, yellow or red.

In yet another embodiment, the light source is a red light source, i.e. emitting in a wavelength range of e.g. between 600 nm and 800 nm. Such a red light source may be e.g. a red light source of any of the above mentioned types directly emitting red light or provided with a phosphor suitable for converting the light source light to red light. This embodiment is particularly advantageous in combination with a light guide adapted for converting the light source light to IR light, i.e. light with a wavelength of more than about 800 nm and in a suitable embodiment with a peak intensity in the range from 810 to 850 nm. In an embodiment such a light guide preferably comprises an IR emitting phosphor. A light emitting device with these characteristics is especially advantageous for use in night vision systems, but may also be used in any of the applications mentioned above.

In embodiments light guides generally are rod shaped or bar shaped light guides comprising a height H, a width W, and a length L extending in mutually perpendicular directions and is in an embodiment transparent and luminescent.

The height H is preferably <10 mm, more preferably <5, most preferably <2 mm. The width W is preferably <10 mm, more preferably <5, most preferably <2 mm. The length L is preferably larger than the width W and the height H, more preferably at least 2 times the width W or 2 times the height H, most preferably at least 3 times the width W or 3 times the height H. The aspect ratio of the Height H:Width W is typically 1:1 (for e.g. general light source applications) or 1:2, 1:3 or 1:4 (for e.g. special light source applications such as headlamps) or 4:3, 16:10, 16:9 or 256:135 (for e.g. display applications).

In embodiments light guides generally comprise a light input surface and a light exit surface. The light exit surface can have any shape, but is in an embodiment shaped as a square, rectangle, round, oval, triangle, pentagon, or hexagon.

The generally rod shaped or bar shaped light guide can have any cross sectional shape, but in embodiments has a cross section the shape of a square, rectangle, round, oval, triangle, pentagon, or hexagon. In embodiments light guides generally are cuboid, but may be provided with a different shape than a cuboid, with the light input surface having somewhat the shape of a trapezoid. By doing so, the light flux may be even enhanced, which may be advantageous for some applications.

Suitable materials for embodiments of light guides are sapphire, polycrystalline alumina and/or undoped transparent garnets such as YAG, LuAG having a refractive index of n=1.7. An additional advantage of this material (above e.g. glass) is that it has a good thermal conductivity, thus diminishing local heating. Other suitable materials include, but are not limited to, glass, quartz and transparent polymers. In another embodiment the light guide material is lead glass. Lead glass is a variety of glass in which lead replaces the calcium content of a typical potash glass and in this way the refractive index can be increased. Ordinary glass has a refractive index of n=1.5, while the addition of lead produces a refractive index ranging up to 1.7.

The light guide or waveguide comprises a luminescent material for converting the light to another spectral distribution. Suitable luminescent materials as used in embodiments of the invention include inorganic phosphors, such as doped YAG, LuAG, organic phosphors, organic fluorescent dyes and quantum dots which are highly suitable for the purposes of embodiments of the present invention.

Quantum dots are small crystals of semiconducting material generally having a width or diameter of only a few nanometers. When excited by incident light, a quantum dot emits light of a color determined by the size and material of the crystal. Light of a particular color can therefore be produced by adapting the size of the dots. Most known quantum dots with emission in the visible range are based on cadmium selenide (CdSe) with a shell such as cadmium sulfide (CdS) and zinc sulfide (ZnS). Cadmium free quantum dots such as indium phosphide (InP), and copper indium sulfide (CuInS2) and/or silver indium sulfide (AgInS2) can also be used. Quantum dots show very narrow emission band and thus they show saturated colors. Furthermore the emission color can easily be tuned by adapting the size of the quantum dots. Any type of quantum dot known in the art may be used in embodiments of the present invention. However, it may be preferred for reasons of environmental safety and concern to use cadmium-free quantum dots or at least quantum dots having very low cadmium content.

Organic fluorescent dyes can be used as well. The molecular structure can be designed such that the spectral peak position can be tuned. Examples of suitable organic fluorescent dyes materials are organic luminescent materials based on perylene derivatives, for example compounds sold under the name Lumogen® by BASF. Examples of suitable compounds include, but are not limited to, Lumogen® Red F305, Lumogen® Orange F240, Lumogen® Yellow F083, and Lumogen® F, 170.

Obviously, the luminescent material may also be an inorganic phosphor. Examples of inorganic phosphor materials include, but are not limited to, cerium (Ce) doped YAG (Y3Al5O12) or LuAG (Lu3Al5O12). Ce doped YAG emits yellowish light, whereas Ce doped LuAG emits yellow-greenish light. Examples of other inorganic phosphors materials which emit red light may include, but are not limited to ECAS and BSSN; ECAS being Ca1-xAlSiN3:Eux wherein $0<x\leq1$, preferably $0<x\leq0.2$; and BSSN being Ba2-x-zMxSi5-yAlyN8-yOy:Euz wherein M represents Sr or Ca, $0\leq x\leq1$, $0\leq y\leq4$, and $0.0005\leq z\leq0.05$, and preferably $0\leq x\leq0.2$.

According to an embodiment of the present invention, the luminescent material is essentially made of material selected from the group comprising (M<I>1-x-yM<II>xM<III>y)3(M<IV>1-zM<V>z)5O12- where M<I> is selected from the group comprising Y, Lu or mixtures thereof, M<II> is selected from the group comprising Gd, La, Yb or mixtures thereof, M<III> is selected from the group comprising Tb, Pr, Ce, Er, Nd, Eu or mixtures thereof, M<IV> is Al, M<V> is selected from the group comprising Ga, Sc or mixtures thereof, and $0\leq x\leq1$, $0\leq y\leq0.1$, $0\leq z\leq1$(M<I>1-x-yM<II>x, M<III>y)2O3- where M<I> is selected from the group comprising Y, Lu or mixtures thereof, M<II> is selected from the group comprising Gd, La, Yb or mixtures thereof, M<III> is selected from the group comprising Tb, Pr, Ce, Er, Nd, Eu, Bi, Sb or mixtures thereof, and $0\leq x\leq1$, $0\leq y\leq0.1$, (M<I>1-x-yM<II>xM<III>y)S1-zSez- where M<I> is selected from the group comprising Ca, Sr, Mg, Ba or mixtures thereof, M<II> is selected from the group comprising Ce, Eu, Mn, Tb, Sm, Pr, Sb, Sn or mixtures thereof, M<III> is selected from the group comprising K, Na, Li, Rb, Zn or mixtures thereof, and $0\leq x\leq0.01$, $0\leq y\leq0.05$, $0\leq z\leq1$, (M<I>1-x-yM<II>xM<III>y)O— where M<I> is selected from the group comprising Ca, Sr, Mg, Ba or mixtures thereof, M<II> is selected from the group comprising Ce, Eu, Mn, Tb, Sm, Pr or mixtures thereof, M<III> is selected from the group comprising K, Na, Li, Rb, Zn or mixtures thereof, and $0\leq x\leq0.1$, $0\leq y\leq0.1$, (M<I>2-xM<II>xM<III>2)O7- where M<I> is selected from the group comprising La, Y, Gd, Lu, Ba, Sr or mixtures thereof, M<II> is selected from the group comprising Eu, Tb, Pr, Ce, Nd, Sm, Tm or mixtures thereof, M<III> is selected from the group comprising Hf, Zr, Ti, Ta, Nb or mixtures thereof, and $0<=x<=1$, (M<I>1-xM<II>xM<III>1-yM<IV>y)O3- where M<I> is selected from the group comprising Ba, Sr, Ca, La, Y, Gd, Lu or mixtures thereof, M<II> is selected from the group comprising Eu, Tb, Pr, Ce, Nd, Sm, Tm or mixtures thereof, M<III> is selected from the group comprising Hf; Zr, Ti, Ta, Nb or mixtures thereof, and M<IV> is selected from the group comprising Al, Ga, Sc, Si or mixtures thereof, and $0\leq x\leq0.1$, $0\leq y\leq0.1$, or mixtures thereof.

Particularly suitable luminescent materials, however, are Ce doped Yttrium aluminum garnet (YAG, $Y_3Al_5O_{12}$) and Lutetium-Aluminum-Garnet (LuAG).

Each of the two or more luminescent light guides comprises a different central emission wavelength within a blue color-range or within a green color-range or within a red color-range. The blue color-range is defined between 380 nanometer and 495 nanometer, the green color-range is defined between 495 nanometer and 590 nanometer, and the red color-range is defined between 590 nanometer and 800 nanometer.

Turning now to FIG. 1, a 3-dimensional perspective view of a light emitting device 1000 according an embodiment is shown comprising a light guide 400 adapted for converting incoming light with a first spectral distribution to light with a second, different spectral distribution.

The light guide 400 shown in FIG. 1 differs from the remaining embodiments described herein in that it comprises or is constructed as a wavelength converter structure 6000 having a first conversion part 61100 in the form of a UV to blue wavelength converter and a second conversion part 61200 in the form of a phosphor adapted to emit white light 14 based on the blue light input from the first conversion part 61100. Hence, the light emitting device 1000 shown in FIG. 1 comprises a light source in the form of a plurality of LEDs 2100, 2200, 2300 emitting light in the UV to blue wavelength range. The LEDs 2100, 2200, 2300 are arranged on a base or substrate 1500. Particularly, the first conversion part 61100 consists of a polycrystalline cubic Yttrium Aluminum Garnet (YAG), doped with rare earth ions, in an embodiment Europium and/or Terbium, while the second conversion part 61200 is a yellow phosphor. In an embodiment, the first conversion part 61100 is cubic or bar-shaped.

This embodiment is advantageous in that the surface area of the light exit surface is smaller than the surface area required to build a light source consisting of direct light emitting LEDs. Thereby, a gain in etendue can be realized.

Alternatives for generating white light with a blue or UV light source include but are not limited to:
 LEDs emitting blue light, which light is converted to green/blue light in the first conversion part 61100, which in turn is converted to white light by the second conversion part being provided as a red phosphor, and
 LEDs emitting blue light, which light is converted to green light in the first conversion part 61100, which in turn is mixed with red and blue light to generate a white LED source, wherein the mixing is achieved by means of a second conversion part in the form of a red phosphor in front of which a diffusor is arranged.

A selection of phosphors according to embodiments of the invention is given in table 1 below along with the maximum wavelength which they are capable of emitting.

TABLE 1

| Phosphor | Maximum emission wavelength (nm) |
| --- | --- |
| CaGa2S4:Ce | 475 |
| SrGa2S4:Ce | 450 |
| BaAl2S4:Eu | 470 |
| CaF2:Eu | 435 |
| Bi4Si3O12:Ce | 470 |
| Ca3Sc2Si3O12:Ce | 490 |

Figure 2:
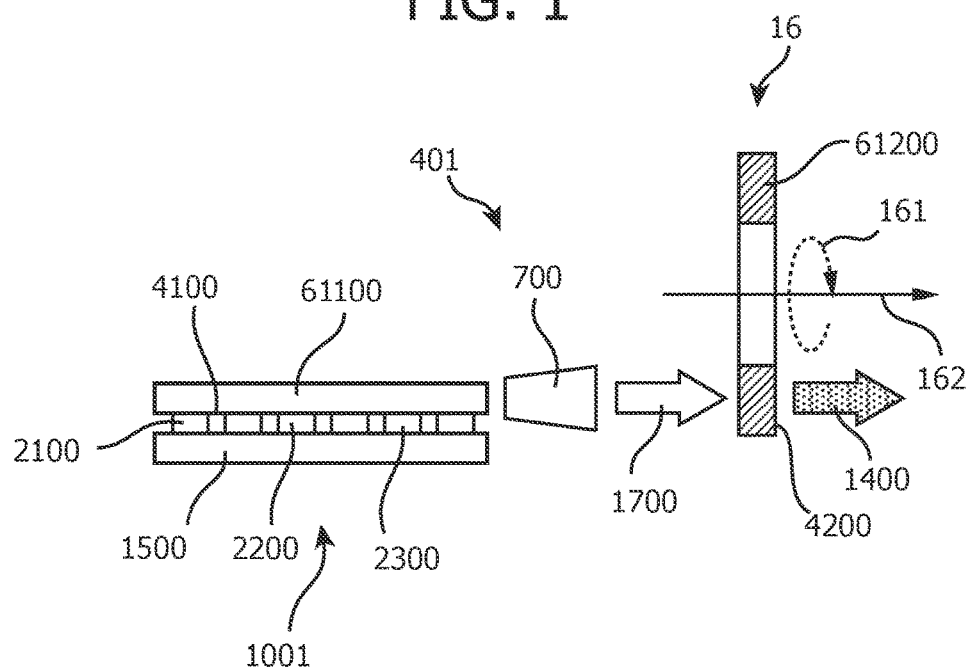
FIGS. 2 and 3 shows two different cross sectional views of a light emitting device comprising a phosphor wheel emitting in the transmissive and reflective mode, respectively.
Figure 3:
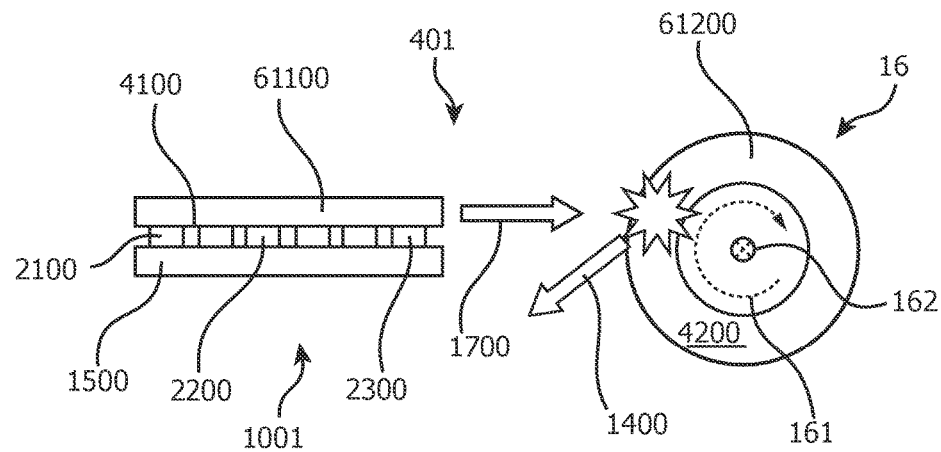

FIGS. 2 and 3 show a light emitting device 1001 according to an embodiment comprising a light guide 401 and adapted for converting incoming light with a first spectral distribution to light with a second, different from the first, spectral distribution.

The light guide 401 shown in FIGS. 2 and 3 differs from the remaining embodiments described herein in that it comprises or is constructed as a wavelength converter structure having a second conversion part 61200 provided in the form of a rotatable phosphor wheel 16, and in that it further comprises a coupling element 700 arranged between the first conversion part 61100 and the second conversion part 61200 or phosphor wheel 16.

The light emitting device 1001 further comprises a light source in the form of a plurality of LEDs 2100, 2200, 2300 arranged on a base or substrate 1500.

The plurality of LEDs 2100, 2200, 2300 are used to pump the first conversion part 61100, which is in the embodiment shown made of a transparent material, to produce light 1700 having a third spectral distribution, such as green or blue light. The phosphor wheel 16, which is rotating in a rotation direction 161 about an axis of rotation 162, is then used for converting the light 1700 to light 1400 having a second spectral distribution, such as red and/or green light. It is noted that in principle any combination of colors of the light 1700 and the light 1400 is feasible.

As shown in FIG. 2, illustrating the phosphor wheel 16 in a cross sectional side view, the phosphor wheel 16 is used in the transparent mode, i.e. incident light 1700 enters the phosphor wheel 16 at one side, is transmitted through the phosphor wheel 16 and emitted from an opposite side thereof forming the light exit surface 4200.

Alternatively, the phosphor wheel 16 may be used in the reflective mode, i.e. such that light is emitted from the same surface as the surface through which it enters the phosphor wheel 16, cf. FIG. 3 illustrating the phosphor wheel 16 in a cross sectional top view.

The phosphor wheel 16 may comprise one phosphor throughout. Alternatively, the phosphor wheel 16 may also comprise segments without any phosphor such that also part of the light 1700 may be transmitted without being converted. In this way sequentially other colors can be generated. In another alternative, the phosphor wheel 16 may also comprise multiple phosphor segments, e.g. segments of phosphors emitting yellow, green and red light, respectively, such as to create a multi-colored light output. In yet another alternative, the light emitting device 1001 may be adapted for generating white light by employing a pixelated phosphor-reflector pattern on the phosphor wheel 16.

The coupling element 700 is in an embodiment an optical element suitable for collimating the light 1700 incident on the phosphor wheel 16, but may also be a coupling medium or a coupling structure such as e.g. the coupling medium or the coupling structure 700 described above.

The light emitting device 1001 may furthermore comprise additional lenses and/or collimators. For example, additional optics may be positioned such as to collimate the light emitted by the light sources 2100, 2200, 2300 and/or the light 1400 emitted by the light emitting device 1001.

Figure 4:
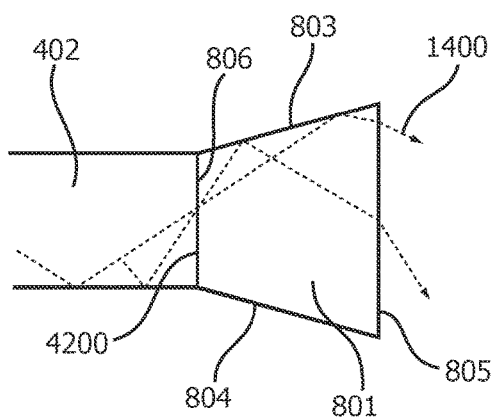
FIG. 4 shows side view of a light guide which is provided with an optical element at an exit surface.

FIG. 4 shows a light guide 402 according to an embodiment. The light guide 402 may be a transparent light guide or a light guide adapted for converting light with a first spectral distribution to light with a second spectral distribution. The light guide 402 shown in FIG. 4 differs from the remaining embodiments described herein in that it comprises an optical element 801 arranged with a light input facet 806 in optical connection with a light exit surface 4200 of the light guide 402.

The optical element 801 is made of a material having a high refractive index, in an embodiment a refractive index which is equal to or higher than that of the light guide 402, and comprises a quadrangular cross section and two tapered sides 803 and 804. The tapered sides 803 and 804 are inclined outwards from the light exit surface 4200 of the light guide 402 such that the light exit facet 805 of the optical element 801 has a larger surface area than both the light input facet 806 and the light exit surface 4200 of the light guide 402. The optical element 801 may alternatively have more than two, particularly four, tapered sides. In an alternative, the optical element 801 has a circular cross section and one circumferential tapered side.

With such an arrangement light will be reflected at the inclined sides 803 and 804 and has a large chance to escape if it hits the light exit facet 805, as the light exit facet 805 is large compared to the light input facet 806. The shape of the sides 803 and 804 may also be curved and chosen such that all light escapes through the light exit facet 805.

Figure 5:
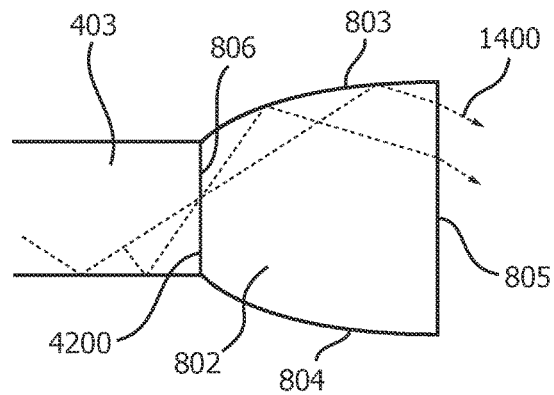
FIG. 5 shows a side view of light guide which is provided with a light concentrating element at an exit surface.

FIG. 5 shows a light guide 403 according to an embodiment. The light guide 403 may be a transparent light guide or a light guide adapted for converting light with a first spectral distribution to light with a second spectral distribution. The light guide 403 shown in FIG. 5 differs from the remaining embodiments described herein in that it comprises a light concentrating element 802 arranged at a light exit surface 4200 of the light guide 403.

The light concentrating element 802 is made of a material, such as a compound material, having high refractive index, in an embodiment a refractive index being equal to or higher than that of the light guide 403, and comprises a quadrangular cross section and two curved sides 803 and 804. The curved sides 803 and 804 are curved outwards from the light exit surface 4200 of the light guide 403 such that the light exit surface 805 of the light concentrating element 802 has a larger surface area than the light exit surface 4200 of the light guide 403. The light concentrating element 802 may alternatively have more than two, particularly four, tapered sides. In an alternative, the light concentrating element 802 has a circular cross section and one circumferential tapered side. In an embodiment, the curved sides 803, 804 are parabolic.

If, in an alternative, the refractive index of the light concentrating element 802 with curved sides 803 and 804 is chosen to be lower than that of the light guide 403 (but higher than that of air), still an appreciable amount of light can be extracted. This allows for a light concentrating element 802 which is easy and cheap to manufacture compared to one made of a material with a high refractive index. For instance, if the light guide 403 has a refractive index of n=1.8 and the light concentrating element 802 has a refractive index of n=1.5 (glass), a gain of a factor of 2 in light output may be achieved. For a light concentrating element 802 with a refractive index of n=1.8, the gain would be about 10% more.

Actually, not all light will be extracted since there will be Fresnel reflections at the interface between the optical element 801 or the light concentrating element 802 and the external medium, generally being air. These Fresnel reflections may be reduced by using an appropriate anti-reflection coating, i.e. a quarter-lambda dielectric stack or moth-eye structure. In case the light output as function of position over the light exit facet 805 is inhomogeneous, the coverage with anti-reflection coating might be varied, e.g. by varying the thickness of the coating.

By using any one of the above structures shown in FIGS. 4 and 5, problems in connection with extracting light from the high-index light guide material to a low-index material like air, particularly related to the efficiency of the extraction, are solved. The situation is different from that in a luminescent solar concentrator, where extraction is to a high-index solar cell. For instance, if the refractive index of the converter is n=1.8, the critical angle for total internal reflection (TIR) with respect to air is 34°. Light with this angle or larger angles with respect to the normal to the side surfaces will be guided to the exit surface by TIR. However, light with an angle of 34° will hit the exit surface at 56° (w.r.t. its normal) and will be reflected there. Only light with an angle smaller than 34° (w.r.t. the normal to the exit surface) will escape. Light with an angle between 34° and 56° would circulate forever in a perfect light guide.

One of the interesting features of a compound parabolic light concentrating element (CPC) 802 as shown in FIG. 5 is that the etendue (=$n^2 \times area \times solid\ angle$, where n is the refractive index) of the light is conserved. The shape and size of the light input facet 806 of the CPC can be adapted to those of the light exit surface 4200 of the light guide 403 and/or vice versa. A large advantage of a CPC is that the incoming light distribution is transformed into a light distribution that fits optimally to the acceptable etendue of a given application. The shape of the light exit facet 805 of the CPC may be e.g. rectangular or circular, depending on the desires.

For instance, for a digital projector there will be requirements to the size (height and width) of the beam, as well as for the divergence. The corresponding etendue will be conserved in a CPC. In this case it will be beneficial to use a CPC with rectangular light input and exit facets 806 and 805 having the desired height/width ratio of the display panel used.

For a spot light application, the requirements are less severe. The light exit facet 805 of the CPC may be circular, but may also have another shape (e.g. rectangular) to illuminate a particularly shaped area or a desired pattern to project such pattern on screens, walls, buildings, infrastructures etc.

Although CPCs offer a lot of flexibility in design, their length can be rather large. In general, it is possible to design shorter optical elements with the same performance. To this end, the surface shape and/or the exit surface may be adapted, e.g. to have a more curved exit surface such as to concentrate the light.

One additional advantage is that the CPC can be used to overcome possible aspect ratio mismatches when the size of the light guide 403 is restrained by the dimensions of the LED and the size of the light exit facet 805 is determined by the subsequent optical components.

Furthermore, it is possible to place a mirror (not shown) partially covering the light exit facet 805 of the CPC, e.g. using a mirror which has a 'hole' near or in its center. In this way the exit plane of the CPC is narrowed down, part of the light is being reflected back into the CPC and the light guide, and thus the exit etendue of the light would be reduced. This would, naturally, decrease the amount of light that is extracted from the CPC and light guide. However, if this mirror has a high reflectivity, like e.g. Alanod 4200AG, the light can be effectively injected back into the CPC and light guide, where it may be recycled by TIR. This will not change the angular distribution of the light, but it will alter the position at which the light will hit the CPC exit plane after recycling thus increasing the luminous flux. In this way, part of the light, that normally would be sacrificed in order to reduce the system etendue, can be re-gained and used to increase for example the homogeneity.

This is of major importance if the system is used in a digital projection application. By choosing the mirror in the different ways, the same set of CPC and light guide can be used to address systems using different panel sizes and aspect ratio's, without having to sacrifice a large amount of light. In this way, one single system can be used for various digital projection applications.

In many applications, such as spot lighting and automotive lighting, it is desired to obtain a light distribution having a particular shape such as to comply with particular requirements given for such applications. For example, for automotive lighting there are requirements specified in the law that are related to the illumination profile of automotive head lights. Also, obtaining a light distribution having a particular shape may be desirable for decorative or aesthetic reasons.

Figure 6:
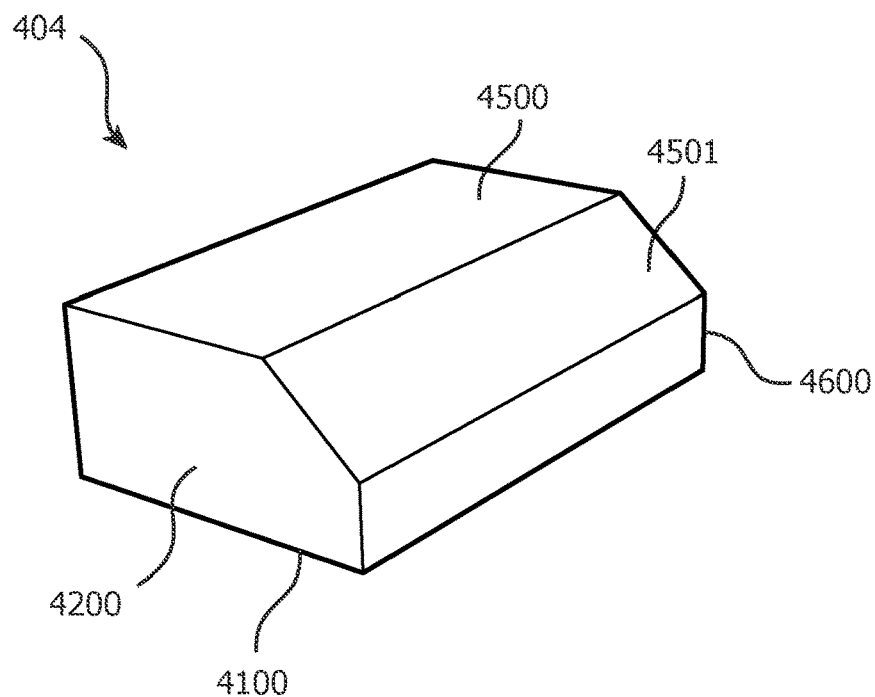
FIG. 6 shows a perspective view of a light guide which is shaped throughout its length such as to provide a shaped light exit surface.
Figure 7:
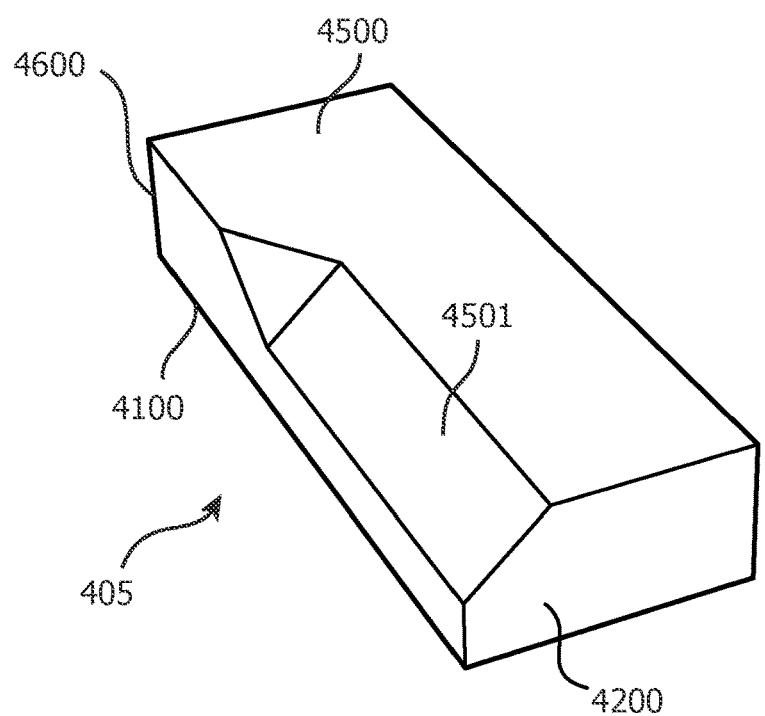
FIG. 7 shows a side view of a light guide which is shaped over a part of its length such as to provide a shaped light exit surface.
Figure 8:
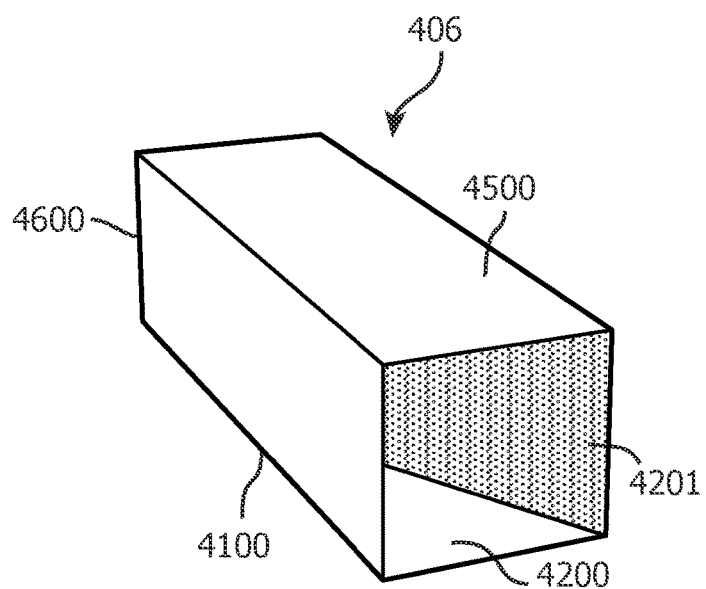
FIG. 8 shows a perspective view of a light guide which is provided with a partially roughened light exit surface.

With reference to FIGS. 6 to 8 different possibilities for providing a light distribution having a particular shape will be described.

FIG. 6 shows a perspective view of a light guide 404 according to an embodiment which is shaped throughout its length in order to provide a shaped light exit surface 4200. The light guide 404 may be a transparent light guide or a light guide adapted for converting light with a first spectral distribution to light with a second spectral distribution.

As may be seen, a part 4501 of the light guide 404 extending throughout the length of the light guide 404, particularly adjacent to the surface 4500 and opposite to the light input surface 4100, has been removed such as to provide the light guide 404 with a shape corresponding to the desired shape of the light distribution at the light exit surface 4200, the shape extending throughout the entire length of the light guide 404 from the light exit surface 4200 to the opposite surface 4600.

FIG. 7 shows a side view of a light guide 405 according to an embodiment which is shaped over a part of its length such as to provide a shaped light exit surface 4200. The light guide 405 may be a transparent light guide or a light guide adapted for converting light with a first spectral distribution to light with a second spectral distribution.

As may be seen, a part 4501 of the light guide 405 extending over a part of the length of the light guide 405, particularly adjacent to the surface 4500 and opposite to the light input surface 4100, has been removed such as to provide the light guide 405 with a shape corresponding to the desired shape of the light distribution at the light exit surface 4200, the shape extending over a part of the length of the light guide 405 adjacent the light exit surface 4200.

Another part or more than one part of the light guide may be removed such as to provide for other shapes of the light exit surface. Any feasible shape of the light exit surface may be obtained in this way. Also, the light guide may be divided partly or fully into several parts having different shapes, such that more complex shapes may be obtained. The part or parts removed from the light guide may be removed by means of e.g. sawing, cutting or the like followed by polishing of the surface that is exposed after the removal of the part or parts. In another alternative a central part of the light guide may be removed, e.g. by drilling, such as to provide a hole in the light exit surface.

In an alternative embodiment shown in FIG. 8, a light distribution having a particular shape may also be obtained by surface treating, e.g. roughening, a part 4201 of the light exit surface 4200 of the light guide 406, whilst leaving the remaining part of the light exit surface 4200 smooth. In this embodiment no parts of the light guide 406 need to be removed. Likewise any combination of the above possibilities for obtaining a light distribution having a particular shape is feasible.

Figure 9:
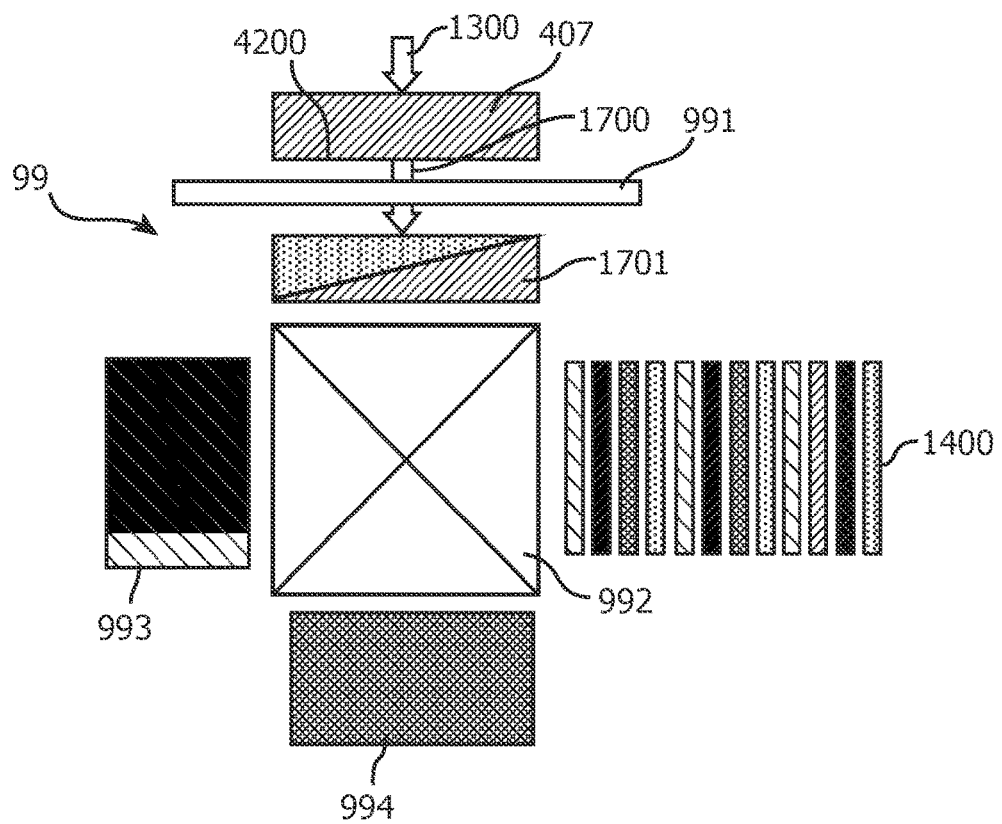
FIG. 9 shows a side view of a light guide which at an exit surface is provided with a filter for providing a filtered light output and a dichroic optical element for combining the filtered light output with light from additional light sources.

FIG. 9 shows a side view of a light guide 407 according to an embodiment. The light guide 407 is adapted for converting incident light 1300 in such a way that the emitted light 1700 is in the yellow and/or orange wavelength range, i.e. roughly in the wavelength range of 560 nm to 600 nm. To this end the light guide 407 may e.g. be provided as a transparent garnet made of ceramic materials such as Ce-doped $(Lu,Gd)_3Al_5O_{12}$, $(Y,Gd)_3Al_5O_{12}$ or $(Y,Tb)_3Al_5O_{12}$. With higher Ce-content and/or higher substitution levels of e.g. Gd and/or Tb in favor of Ce, the spectral distribution of the light emitted by the light guide can be shifted to higher wavelengths. In an embodiment, the light guide 407 is fully transparent.

At the light exit surface 4200 an optical element 99 is provided. The optical element 99 comprises a filter 991 for filtering the light 1700 emitted from the light guide 407 such as to provide filtered light 1701, at least one further light source 993, 994 and an optical component 992 adapted for combining the filtered light 1701 and the light from the at least one further light source 993, 994 such as to provide a common light output 1400. The filter 991 may be an absorption filter or a reflective filter, which may be fixed or switchable. A switchable filter may e.g. be obtained by providing a reflective dichroic mirror, which may be low-pass, band-pass or high-pass according to the desired light output, and a switchable mirror and placing the switchable mirror upstream of the dichroic mirror seen in the light propagation direction. Furthermore, it is also feasible to combine two or more filters and/or mirrors to select a desired light output. The filter 991 shown in FIG. 9 is a switchable filter enabling the transmission of unfiltered yellow and/or orange light or filtered light, particularly and in the embodiment shown filtered red light, according to the switching state of the filter 991. The spectral distribution of the filtered light depends on the characteristics of the filter 991 employed.

The optical component 992 as shown may be a cross dichroic prism also known as an X-cube or it may in an alternative be a suitable set of individual dichroic filters.

In the embodiment shown two further light sources 993 and 994 are provided, the further light source 993 being a blue light source and the further light source 994 being a green light source. Other colors and/or a higher number of further light sources may be feasible too. A further option is to use the light filtered out by the filter 991 as a further light source.

The common light output 1400 is thus a combination of light 1701 emitted by the light guide 407 and filtered by the filter 991 and light emitted by the respective two further light sources 993 and 994. The common light output 1400 may advantageously be white light.

The solution shown in FIG. 9 is advantageous in that it is scalable, cost effective and easily adaptable according to the requirements for a given application of a light emitting device according to embodiments of the invention.

In a further advantageous embodiment cooling of the light guide 407 is provided—e.g. by providing one or more heat sink elements as will be described further below in relation to FIGS. 11A and 11B.

Figure 10:
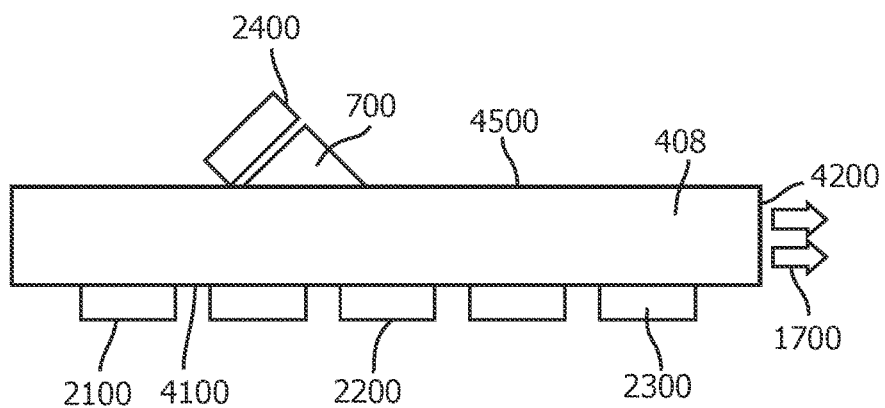
FIG. 10 shows a light guide which is provided with a second light source arranged at a surface of the light guide different from a first light input surface.

FIG. 10 shows a side view of a light guide 408 according to an embodiment. The light guide 408 comprises first light sources 2100, 2200, 2300 emitting light with a first spectral distribution and being arranged adjacent the light input surface 4100 of the light guide 408. The light guide 408 furthermore comprises at least one second light source 2400 emitting light with a second spectral distribution, which is different from the first spectral distribution, and being arranged adjacent to a surface 4500 of the light guide 408 extending parallel and opposite to the light input surface 4100.

The light guide 408 is adapted for converting at least a part of the light with the first spectral distribution to light with a third spectral distribution different from the first spectral distribution and for guiding the light with the second spectral distribution without converting it. In this way the light 1700 emitted by the light guide 408 through the light exit surface 4200 comprises a combination of at least the light with the second and third spectral distribution, respectively, and possibly also of the light with the first spectral distribution, as part of this light may remain unconverted.

By way of a non-limiting example, the first spectral distribution may be in the wavelength range below 400 nm, the second spectral distribution may be in the red wavelength range, i.e. 500 to 800 nm and the third spectral distribution may be in the wavelength range 400 to 500 nm. By way of another non-limiting example, the first spectral distribution may be in the green wavelength range, i.e. 400 to 500 nm, the second spectral distribution may be in the red wavelength range, i.e. 500 to 800 nm and the third spectral distribution may be in the wavelength range 440 to 600 nm. By way of yet another non-limiting example the first light sources 2100, 2200, 2300 may be emitting in the wavelength range 440 to 480 nm, the light guide 408 may convert the light emitted by the first light sources to light with a wavelength in the range 480 to 600 nm and the second light source 2400 may be emitting in the wavelength range 600 to 800 nm. It is noted that in principle all feasible combinations of first, second and third spectral distributions may be used. Thereby a simple and efficient way of producing white light is obtained.

It is noted that the second light source 2400 may be provided at any one of the surfaces of the light guide 408 different from the light input surface 4100. Also, more than one second light source may be provided.

As shown on FIG. 10 the light guide 408 further comprises a coupling element 700 adapted for coupling light from the second light source 2400 into the light guide 408. The coupling element 700 may be a coupling structure or coupling medium as described above. It is noted that the coupling element is an optional element, and may thus also be omitted, in which case the second light source may be arranged in direct optical contact with the light guide.

Furthermore, second light sources may alternatively or additionally be arranged at more than one of the surfaces of the light guide 408 different from the light input surface 4100, e.g. at two different surfaces. In such an embodiment it is furthermore feasible to provide second light sources emitting light with different spectral distributions such that second light sources arranged at different surfaces emit light having different spectral distributions.

Figure 11A:
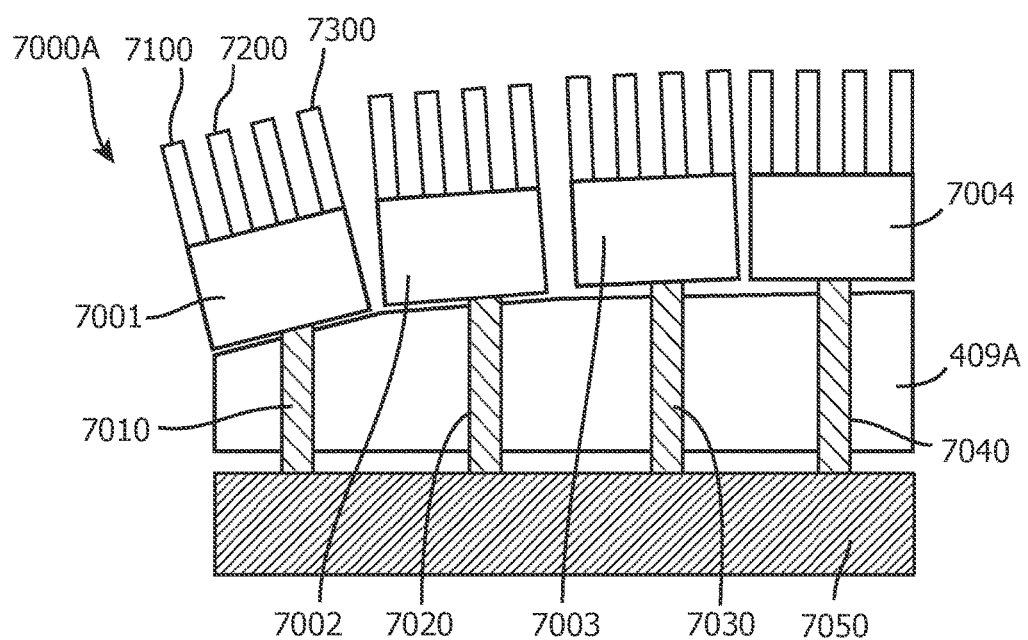
FIGS. 11A and 11B show two different embodiments of a light guide provided with a heat sink element arranged adjacent a surface of the light guide.
Figure 11B:
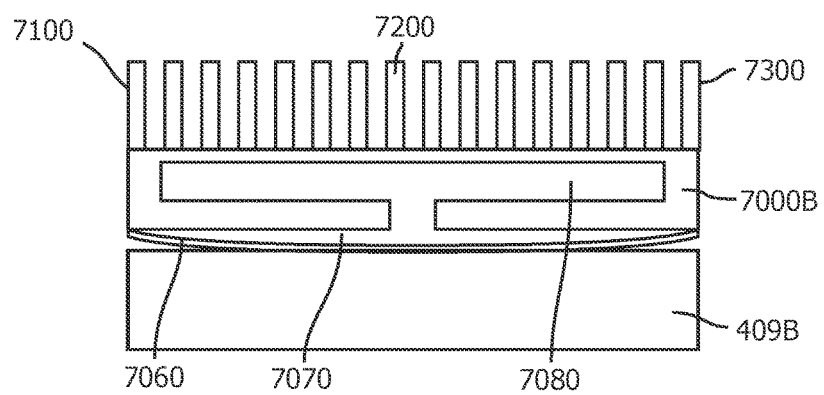

FIGS. 11A and 11B shows a side view of a light guide 409A and a light guide 409B, respectively, according to an embodiment. Generally the light guides shown in FIGS. 11A and 11B comprise a heat sink element 7000A, 7000B, respectively, arranged on one of the surfaces of the light guide 409A, 409B, respectively, different from the light input surface, preferably in a distance of about 30 μm or less therefrom.

Irrespective of the embodiment the respective heat sink element 7000A, 7000B comprises fins 7100, 7200, 7300 for improved heat dissipation, the fins, however, being optional elements.

Irrespective of the embodiment the respective heat sink element 7000A, 7000B is a heat sink element adapted to be conformable to the surface shape of the light guide, and is thus adapted for providing a conformal thermal contact over the whole contact area with the light guide. Thereby improved cooling of the light guide is obtained and the existing tolerance limits on the positioning of the heat sink element become less critical.

FIG. 11A shows an embodiment in which the heat sink element 7000A comprises a plurality of heat sink parts, here four heat sink parts 7001, 7002, 7003 and 7004, one or more of which, here all four, may be provided with fins. Obviously, the more heat sink parts the heat sink element 7000A comprises, the more precisely the heat sink element 7000 may be conformed to the surface of the light guide. Each heat sink part 7001, 7002, 7003, 7004 is adapted for providing a conformal thermal contact over the whole contact area with the light guide. The heat sink parts may be arranged in mutually different distances from the surface of the light guide.

Furthermore, the heat sink element 7000A comprises a common carrier 7050 to which the heat sink parts 7001, 7002, 7003 and 7004 are attached individually by means of attachment elements 7010, 7020, 7030 and 7040, respectively. Alternatively each heat sink part may be assigned its own carrier. It is noted that these elements are optional.

FIG. 11B shows another embodiment in which the heat sink element 7000B comprises a bottom part 7060 adapted to be conformable to the shape of the surface of the light guide 409B at which it is to be arranged. The bottom part 7060 is flexible and may e.g. be a thermally conductive metal layer such as a copper layer.

The heat sink element 7000B further comprises a thermally conductive layer 7070 arranged between the bottom element 7060 and the remainder of the heat sink element 7000B for improved flexibility and conformability of the heat sink element 7000B. The thermally conductive layer 7070 may e.g. be a thermally conductive fluid or paste. The thermally conductive layer 7070 is in an embodiment highly reflective and/or comprises a highly reflective coating.

The heat sink element 7000B further comprises a fluid reservoir 7080 arranged inside the heat sink element 7000B for generating a fluid flow for improved heat dissipation. In an alternative, the fluid reservoir 7080 may also be arranged externally on the heat sink element 7000B, e.g. extending along a part of or the whole external periphery of the heat sink element 7000B. The fluid flow may be enhanced by means of a pump.

It is noted that the conductive layer 7070 and the fluid reservoir 7080 are optional elements.

Irrespective of the embodiment, the heat sink element 7000A, 7000B may be made of a material selected from copper, aluminum, silver, gold, silicon carbide, aluminum nitride, boron nitride, aluminum silicon carbide, beryllium oxide, silicon-silicon carbide, aluminum silicon carbide, copper tungsten alloys, copper molybdenum carbides, carbon, diamond, graphite, and combinations of two or more thereof.

Furthermore, a heat sink element combining features of the embodiments described above is feasible. Also, it is feasible to arrange a heat sink element according to any of the above embodiments at more than one surface of the light guide 409A or 409B.

Finally it is noted that the provision of a heat sink element as described above is especially advantageous in embodiments of a light emitting device according to the invention employing a light source emitting in the red wavelength range and/or being adapted for emitting light in the infrared wavelength range, e.g. by comprising an IR emitting phosphor.

FIGS. 12A to 12D show side views of a light guide 4010A, 4010B, 4010C and 4010D, respectively, according to an embodiment. In this embodiment the light guides shown in FIGS. 12A to 12D comprise a light polarizing element 9001 arranged adjacent to the light exit surface 4200 of the respective light guide 4010A, 4010B, 4010C, 4010D as well as a reflective element 7400 arranged at a surface 4600 of the respective light guide 4010A, 4010B, 4010C, 4010D extending opposite to the light exit surface 4200. Thereby a polarized light source having a high brightness and a high efficiency may be obtained.

Irrespective of the embodiment the polarizing element 9001 may be any one of a reflective linear polarizer and a reflective circular polarizer. Wire grid polarizers, reflective polarizers based on stack of polymer layers comprising birefringent layers are examples of reflective linear polarizers. Circular polarizers can be obtained using polymers in the so-called cholesteric liquid crystal phase to make so-called cholesteric polarizers transmitting only light of one polarization and of a specific spectral distribution. Alternatively or in addition to the reflective polarizers, polarizing beam splitters can also be employed. Furthermore scattering polarizers can also be used. In another embodiment, polarization by reflection may be used, e.g. by means of a polarizing element in the form of a wedge made of a material like glass, in which light is incident close to the Brewster angle. In yet another embodiment, the polarizing element 9001 may be a so-called polarized backlight such as described in WO 2007/036877 A2. In yet another embodiment, the polarizing element 9001 may be a polarizing structure.

Figure 12A:
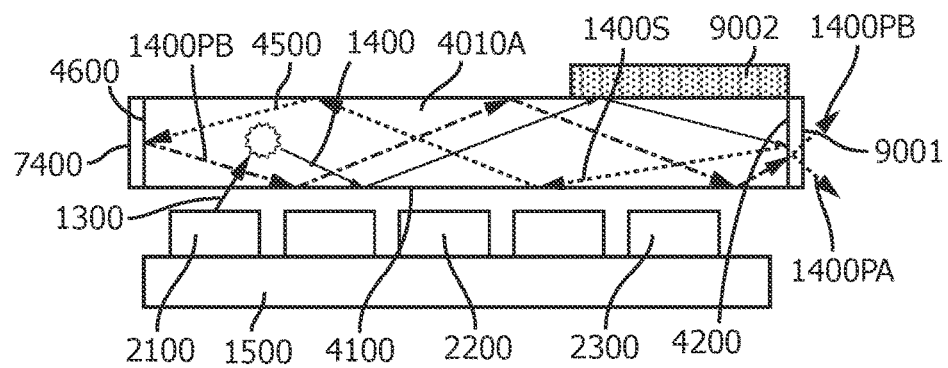
FIGS. 12A to 12D show four different embodiments of a light guide provided with a polarizing element arranged adjacent to the light exit surface of the light guide.

FIG. 12A shows an embodiment in which the polarizing element 9001 is arranged on the light exit surface 4200 of the light guide 4010A. The light sources 2100, 2200, 2300 emit first light 1300 having a first spectral distribution, which the light guide 4010A is adapted to convert into second light 1400 having a second spectral distribution. Due to the polarizing element 9001 only light of a first polarization, in FIG. 12A p-polarized light 1400PA, is transmitted and emitted from the light exit surface 4200 and light of a second polarization, in FIG. 12A s-polarized light 1400S, is reflected back into the light guide 4010A. The reflected s-polarized light 1400S is reflected by the reflective element 7400. When reflected, at least a part of the reflected s-polarized light 1400S is altered into p-polarized light 1400PB which is transmitted by the polarizing element 9001. Thus, a light output comprising only light with a first polarization, in FIG. 12A p-polarized light 1400PA, 1400PB is obtained.

Furthermore, the light guide 4010A comprises a ¼ lambda plate 9002 arranged at one of the surfaces extending between the light exit surface 4200 and the surface 4600, in the embodiment shown the surface 4500. In the embodiment shown the ¼ lambda plate 9002 covers the surface 4500 partially. Alternatively, the ¼ lambda plate may cover the surface 4500 completely or it may comprise two or more separate segments. Alternatively or in addition thereto, further ¼ lambda plates may be arranged at one or more other of the surfaces extending between the light exit surface 4200 and the surface 4600. In yet another embodiment the ¼ lambda plate 9002 may be arranged between the light guide and the reflective element 7400 such that a gap is provided between the ¼ lambda plate and the light guide. A ¼ lambda plate 9002 may be used for converting light with a first polarization into light with a second polarization, particularly for converting circularly polarized light into linearly polarized light. It is noted, however, that irrespective of the embodiment the ¼ lambda plate 9002 is an optional element, and that it thus may also be omitted.

Figure 12B:
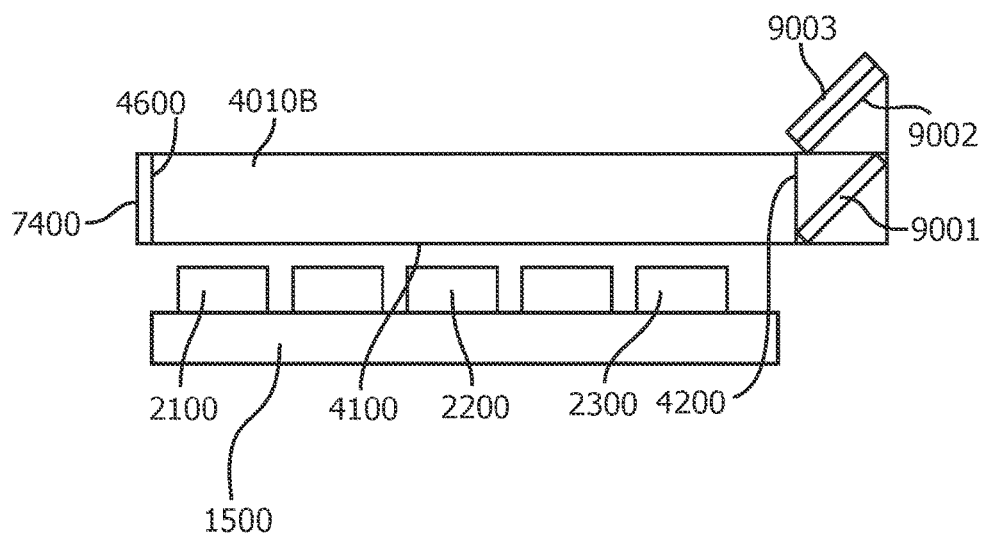

FIG. 12B shows an embodiment in which the polarizing element 9001 is arranged angled with respect to the light exit surface 4200, as shown in an angle of 45° relative to the light exit surface 4200 although any angle is in principle feasible. Furthermore, a ¼ lambda plate 9002 and a reflective element 9003 stacked on top of each other is arranged in the beam path downstream of the polarizing element 9001 and such that they extend substantially in parallel with the polarizing element 9001. Thereby, reflected light with a first polarization is coupled out of the light guide 4010B and is thereupon altered into light with a second polarization by the polarizing element 9001, Subsequently the light with the second polarization is redirected by the reflective element 9003 and further polarized by the ¼ lambda plate 9002.

Figure 12C:
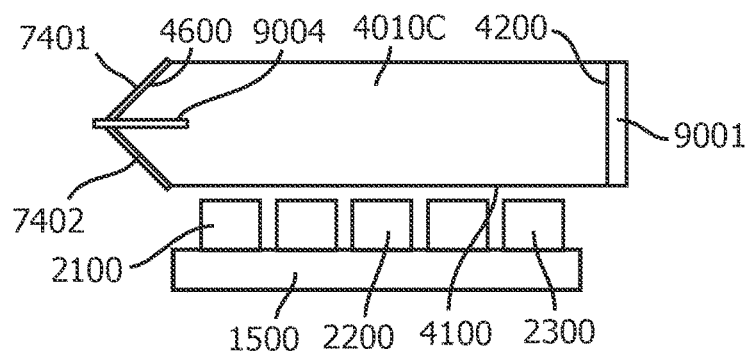

FIG. 12C shows an embodiment very similar to that shown in FIG. 12A but according to which the light guide 4010C as an alternative comprises a tapered surface 4600 opposite to the light exit surface 4200. The tapered surface 4600 is provided with reflective elements 4701, 4702 separated by an insert in the form of a ½ lambda plate 9004.

Figure 12D:
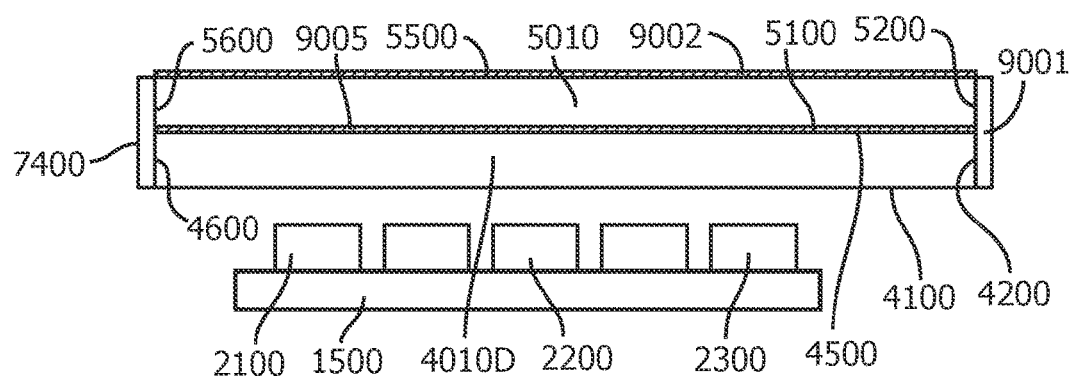

FIG. 12D shows an embodiment in which two light guides 4010D and 5010 are stacked such that the surface 4500 of the light guide 4010D and the light input surface 5100 of the light guide 5010 face each other and with a further polarizing element 9005 arranged in-between and in optical contact with the light guides 4010D and 5010. A polarizing element 9001 is arranged on the light exit surfaces 4200 and 5200 of the light guides 4010D and 5010 and a reflective element 7400 is arranged on the surfaces 4600 and 5600 of the light guides 4010D and 5010 opposite the respective light exit surfaces 4200, 5200. The further polarizing element 9005 transmits light with a polarization being perpendicular to the polarization of the light transmitted by the polarizing element 9001. A ¼ lambda plate 9002 may be applied to at least a part of the surface 5500 of the light guide 5010.

In further alternative embodiments the polarizing element 9001 may be provided as a part of an optical element arranged at the light exit surface 4200 of the light guide. In one particular embodiment the polarizing element 9001 is then arranged such as to be located opposite to the light exit surface 4200 in the mounted position of the optical element. By way of example such an optical element may for instance be an optical element 801, a compound parabolic light concentrating element (CPC) 802 or an optical element 99 as described above and shown in FIGS. 4, 5 and 9, respectively. Alternatively, such an optical element may be a light mixing chamber. Particularly in case of a CPC a ¼ lambda plate may be arranged in the CPC opposite to the polarizing element 9001.

Figure 13:
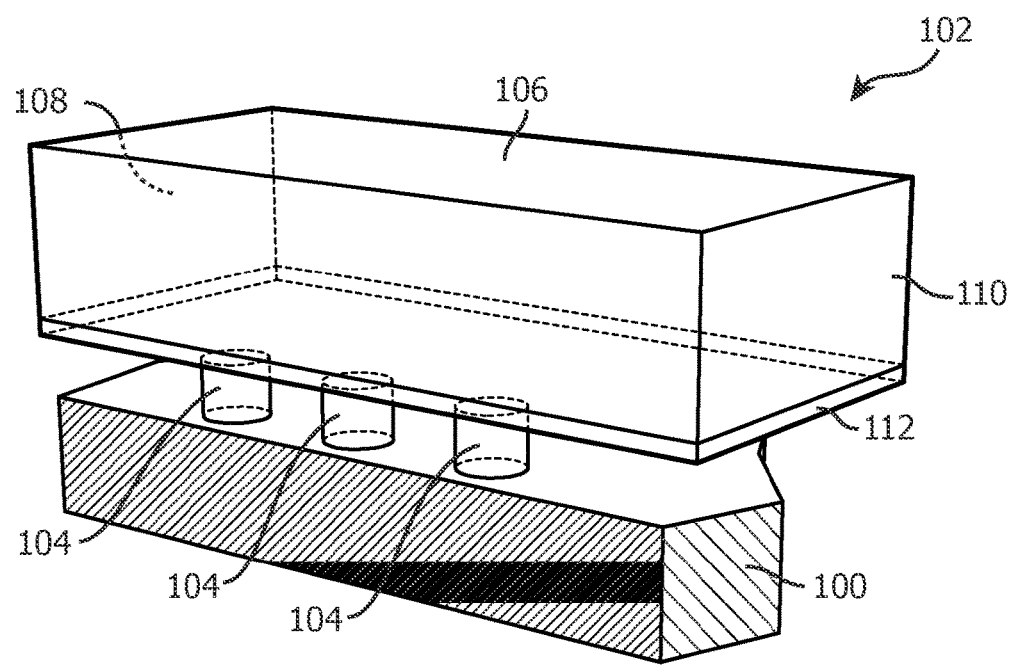
FIG. 13 is a perspective view of a light emitting device according to an embodiment of the invention.

FIG. 13 is a perspective view of a light emitting device 102 according to an embodiment of the invention, the light emitting device 102 comprises a heat sink 100, a wavelength converter 106, where the wavelength converter 106 has a light exit surface 110 and a surface 108 opposite the light exit surface. The light emitting device 102 further comprises a plurality of light sources 104 which will, in use, emit light towards the wavelength converter 106 through an optical coupling element 112. The optical coupling element 112 is shaped as a layer less than 100 micrometers thick, and is configured to guide light between the light source 104 and the wavelength converter 106. The light entrance surface of the wavelength converter 106 is defined as the interface between the optical coupling element 112 and the wavelength converter 106. In use, the light source 104 mounted on the heat sink 100, will emit light of a first wavelength into the optical coupling element 112, from where the light will enter the wavelength converter 106 through the light entrance surface of the wavelength converter. The heat sink 100 may for example be a part of the substrate on which the light sources 104 are formed, or it may be a separate structure on which the light sources 104 are arranged. The heat sink 100 may furthermore provide active or passive cooling.

The optical coupling element 112 will have a refractive index which is lower than the refractive index of the wavelength converter 106. The refractive index of the optical coupling element 112 is in the range of 1.0-1.7, preferably 1.1-1.6 and most preferably 1.2-1.5 and the refractive index of the wavelength converter 106 is in the range of 1.5-2.0, preferably 1.7-1.9 and most preferably 1.8. As an example, the wavelength converter may preferably comprise Ce doped Yttrium Aluminum Garnet (YAG, Y3Al5O12) and Lutetium-Aluminum-Garnet (LuAG) having a refractive index around 1.8. Then the refractive index of the optical coupling element is most preferably in the range 1.2-1.5.

A portion of the light of a first wavelength entering the wavelength converter 106 will be converted into light of a second wavelength, after which conversion process it will be emitted in a random direction. The portion of converted light and a portion which may be unconverted will impinge on the interface between the wavelength converter 106 and a surrounding medium. Due to the selected refractive indexes, the light impinging at the interface between the wavelength converter 110 and the optical coupling element 112 will have a large likelihood of TIR and thereby of being reflected back into the wavelength converter 106. Hence, light will be directed towards the light exit surface 110.

When light is converted within the wavelength converter 106, energy will be dissipated and heat will be produced. The optical coupling element 112 will thermally couple the heat sink 100 to the wavelength converter 106, heat will be transferred through the optical coupling element 112 and hence cool the wavelength converter 106. This will enable the wavelength converter 106 to convert light efficiently for a longer period of time, or indefinitely, without failure or reduced performance due to a high temperature.

In one embodiment, the light source exit surface will be configured to diffusively reflect light, if light is reflected or transmitted in the interface between the wavelength converter 106 and the optical coupling element 112 it will be reflected back towards the light source 104. Therefore having a diffusively reflecting surface will improve the possibility of light being reflected by the light source exit surface to reach the interface between the wavelength converter 106 and optical coupling element 112 through the optical coupling element 112.

Furthermore, the light exit surface 110 is arranged in a plane which is perpendicular to the plane of the light exit surface of the light source 104 and the light entrance surface is arranged in a plane which is parallel to the plane of the light exit surface of the light source 104. Thereby, it is possible to collect light from a large number of LEDs and concentrating the light output to a surface which may be significantly smaller than the combined light input surface, thus providing a wavelength converter which can provide light having a high intensity. In embodiments the light exit surface 110 is arranged in a plane having another angle than perpendicular, but not parallel, with the plane of the light exit surface of the light source 104.

Figure 14:
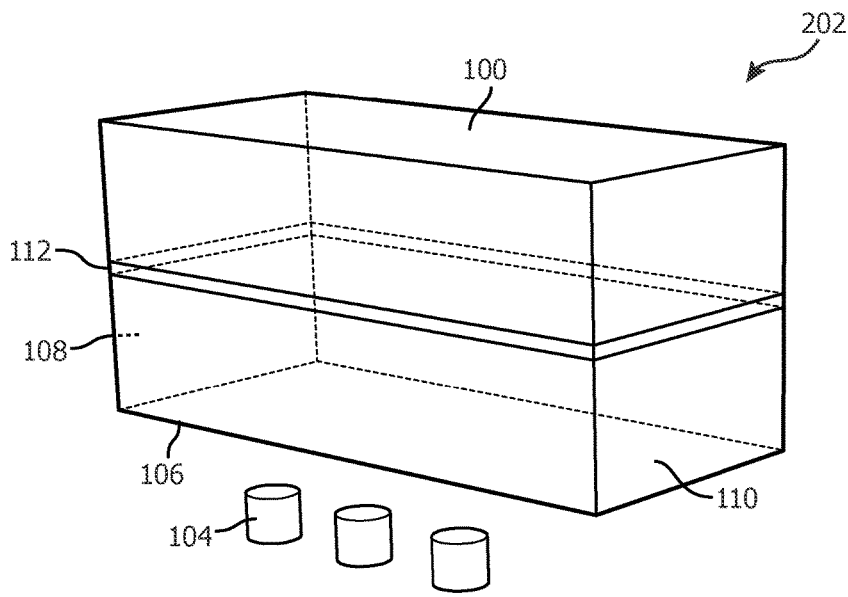
FIG. 14 is a perspective view of a light emitting device according to another embodiment of the invention.

FIG. 14 shows a perspective view of a light emitting device 202 according to another embodiment of the invention. The light emitting device 202 comprises a heat sink 100, a light source 104, a wavelength converter 106, where the wavelength converter has a light exit surface 110 and a surface 108 opposite the light exit surface, and an optical coupling element 112 which is shaped as a layer, less than 100 micrometers thick, and is sandwiched between the heat sink 100 and the wavelength converter 106. In use, the light source 104 arranged at a distance from the wavelength converter 106, will emit light of a first wavelength into the wavelength converter.

The optical coupling element 112 will have a refractive index which is lower than the refractive index of the wavelength converter 106. The refractive index of the optical coupling element 112 is in the range of 1.0-1.7, preferably 1.1-1.6 and most preferably 1.2-1.5 and the refractive index of the wavelength converter 106 is in the range of 1.5-2.0, preferably 1.7-1.9 and most preferably 1.8.

A portion of the light of a first wavelength entering the wavelength converter 106 will be converted into light of a second wavelength, after which conversion process it will be emitted in a random direction. The portion of converted light and a portion which may be unconverted will impinge on the interface between the wavelength converter 106 and a surrounding medium. Due to the selected refractive index the light impinging at the interface will have a large likelihood of TIR and thereby of being reflected back into the wavelength converter 106. Hence, light will be directed towards the light exit surface 110. A portion of light which impinges upon the interface between the wavelength converter 106 and optical coupling element will also have a large likelihood of TIR due to the selected refractive indexes.

A surface of the heat sink 100 facing the wavelength converter 106 will be configured to diffusively reflect light, if light is transmitted in the interface between the wavelength converter 106 and the optical coupling element 112, it will be reflected by this surface back towards the wavelength converter, having a diffusively reflecting surface will improve the possibility of light being reflected by the surface of the heat sink 100 to reach the interface between optical coupling element 112 and the wavelength converter 106 through the optical coupling element 112.

Furthermore the light exit surface 110 is arranged in a plane which is perpendicular to the plane of the light exit surface of the light source 104 and the light entrance surface is arranged in a plane which is parallel to the plane of the light exit surface of the light source 104. Thereby, it is possible to collect light from a large number of LEDs and concentrating the light output to a surface which may be significantly smaller than the combined light input surface, thus providing a wavelength converter which can provide high intensity light. In embodiments the light exit surface 110 is arranged in a plane having another angle than perpendicular, but not parallel, with the plane of the light exit surface of the light source 104. The light source 104 may also be thermally coupled to a heat sink (not shown), thereby de-coupling the thermal contributions of the light source 104 and the wavelength converter 106.

When light is converted within the wavelength converter 106, energy will be dissipated and heat will be produced. The optical coupling element 112 will thermally connect the heat sink 100 and the wavelength converter 106, heat will be transferred through the optical coupling element 112 and hence cool the wavelength converter 106. This will enable the wavelength converter 106 to convert light efficiently for a longer period of time or indefinitely without failure or reduced performance due to a high temperature. In FIG. 14, only one of the surfaces of the wavelength converter 106 is provided with a heat sink 100. It is of course possible to provide a heat sink 100 which covers more of the surfaces, which will allow for larger heat conduction.

Figure 15:
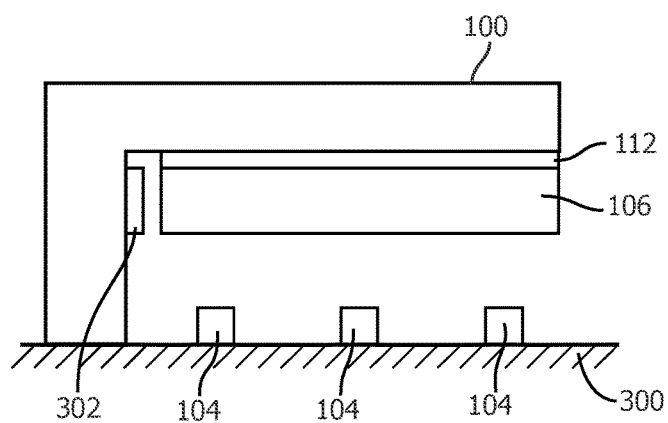
FIG. 15 is a side view of a light emitting device according to another embodiment of the invention.

In FIG. 15, a side view of a light emitting device 102 according to an embodiment of the invention is shown which is similar to the embodiment shown in FIG. 14, however the heat sink 100 is in this embodiment arranged adjacent to at least one more surface of the wavelength converter 106. This will enable the heat sink 100 to thermally couple to the wavelength converter 106 through the surrounding medium. A substrate 300 may also be introduced, upon which the light source 104 is arranged. The substrate 300 may be a heat sink. The substrate 300 and heat sink 100 may be thermally connected, hence it is possible to thermally connect all elements of a light emitting device 102 and provide a light emitting device 102 where all parts may utilize a common heat sink or other cooling arrangement.

Furthermore in the embodiment shown in FIG. 15 a reflecting element 302 may also be introduced, and arranged at a distance facing the surface opposite the light exit surface 108 of the wavelength converter 106. The distance at which the reflecting element 302 is arranged is preferably larger than the first or second wavelength to optically decouple the reflecting element 302 and the wavelength converter 106. In the embodiment shown in FIG. 15 the reflecting element is arranged on the heat sink 100. By arranging the reflecting element 302 on the heat sink 100, it is possible to enable thermal conduction through the heat sink 100 concurrently with optical decoupling of the reflecting element 302 from the light converter 106. However, by introducing spacer elements (not shown) the reflecting element 302 may be arranged at a distance, larger than the first and second wavelength from the light converter without the need for the reflecting element 302 to be arranged on the heat sink 100.

Even though the invention has been described with reference to specific exemplifying embodiments thereof, many different alterations, modifications and the like will become apparent for those skilled in the art. For example the light source could be a laser, OLED, or another material or device producing light.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

The invention claimed is:

1. A light emitting device comprising:
a light source having a light exit surface:
a wavelength converter configured to convert light from a first wavelength to a second wavelength, said wavelength converter having a light exit surface and a light entrance surface which extend in an angle different from zero to one another;
a heat sink; and
an optical coupling element arranged in contact with said wavelength converter, and in thermal connection with said heat sink;
wherein said optical coupling element is selected to have a refractive index in the range of 1.1-1.6, and lower than a refractive index of said wavelength converter, and
said heat sink is thermally connected to said wavelength converter through said optical coupling element.

2. The light emitting device according to claim 1, wherein said light source is arranged in contact with said heat sink, and said optical coupling element is arranged between and in contact with said light exit surface of said light source and said light entrance surface of said wavelength converter.

3. The light emitting device according to claim 1, wherein said optical coupling element is sandwiched between said heat sink and said wavelength converter, and said light source is arranged at a distance from said light entrance surface of said wavelength converter.

4. The light emitting device according to claim 1, wherein said refractive index of said wavelength converter is in the range of 1.5-2.0.

5. The light emitting device according to claim 1, wherein said optical coupling element has a thickness less than 100 micrometers.

6. The light emitting device according to claim 1, wherein said light exit surface of said light source, has a predetermined surface roughness, $R_A$, configured to diffusively reflect light.

7. The light emitting device according to claim 1, wherein a surface of said heat sink facing said wavelength converter, has a predetermined surface roughness, $R_A$, configured to diffusively reflect light.

8. The light emitting device according to claim 1, wherein said wavelength converter comprises a monocrystalline material and/or a monolithic polycrystalline material.

9. The light emitting device according to claim 1, wherein said wavelength converter comprises YAG, LuAG, LuGaAG or LuYAG.

10. The light emitting device according to claim 1, wherein said optical coupling element comprises organic or silicone based oil or glue, or a fluoropolymer.

11. The light emitting device according to claim 1, wherein said wavelength converter is shaped such that said light exit surface is larger than an opposite surface of said wavelength converter.

12. The light emitting device according to claim 11, wherein said wavelength converter is shaped as a wedge or frustum.

13. The light emitting device according to claim 1, further comprising at least one reflecting element, arranged facing, and at a distance from, at least a surface of said wavelength converter opposite said light exit surface of said wavelength converter.

14. The light emitting device according to claim 13, wherein the distance from said at least a surface of said wavelength converter is larger than said first and second wavelength.

15. The light emitting device according to claim 13, wherein said at least one reflecting element is arranged on said heat sink.

* * * * *